Jan. 2, 1945. R. H. VARIAN ET AL Re. 22,587
FIXED FREQUENCY DIFFERENCE STABILIZATION SYSTEM
Original Filed Nov. 20, 1940
FIG. 1
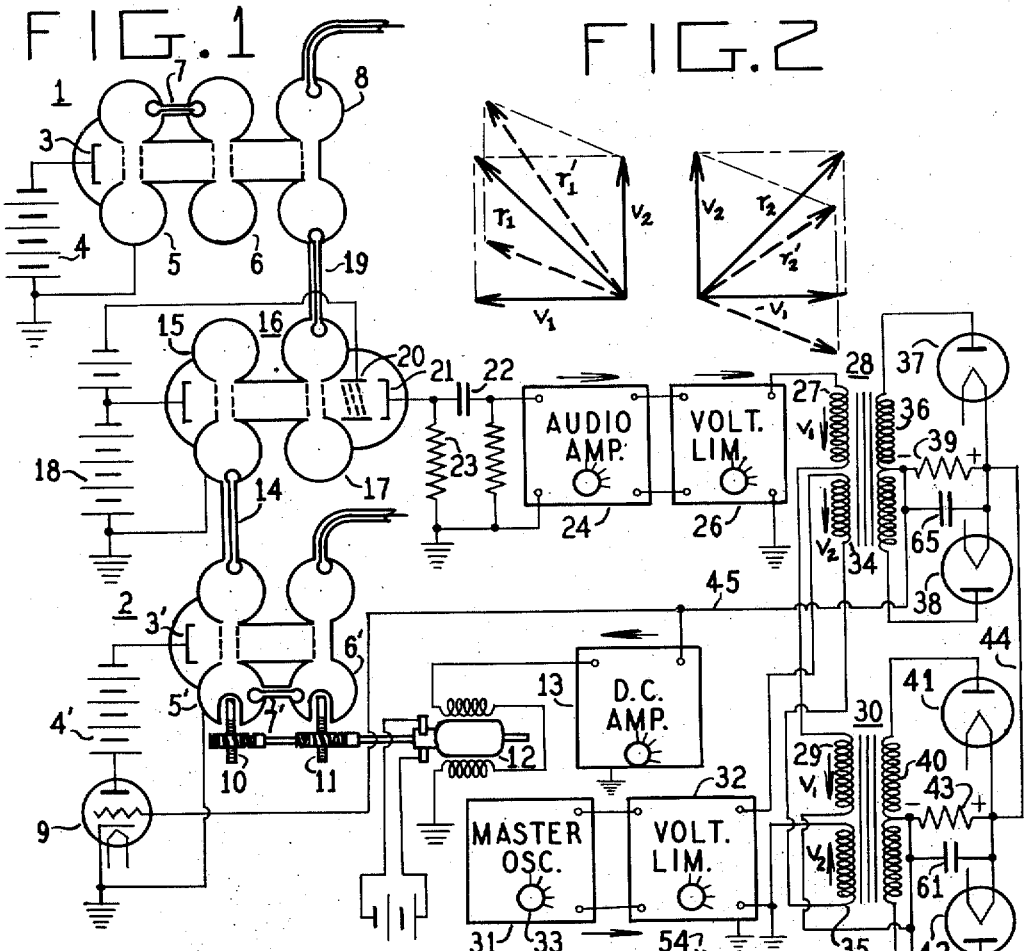
FIG. 2
FIG. 3
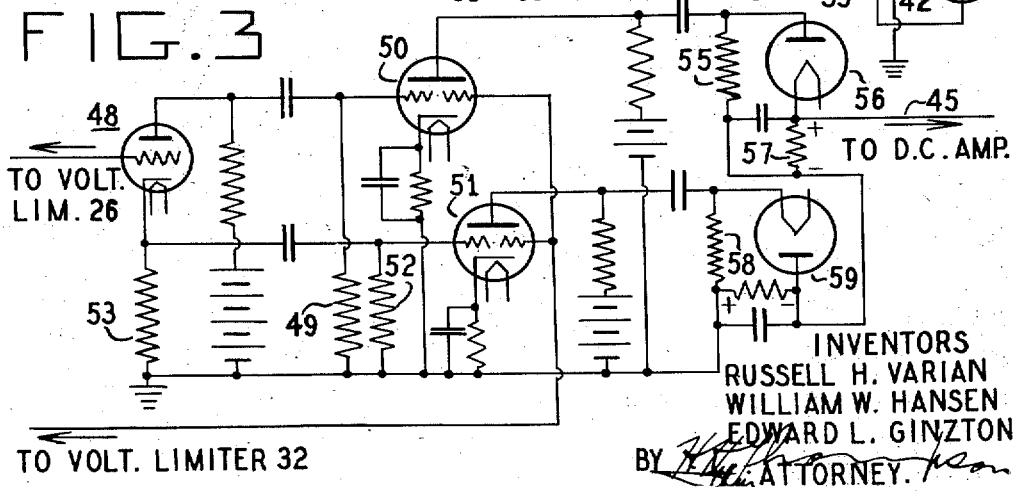
INVENTORS
RUSSELL H. VARIAN
WILLIAM W. HANSEN
EDWARD L. GINZTON
BY ATTORNEY.

Reissued Jan. 2, 1945

Re. 22,587

UNITED STATES PATENT OFFICE 22,587

FIXED FREQUENCY DIFFERENCE STABILIZATION SYSTEM

Russell H. Varian, Wantagh, William W. Hansen, Garden City, and Edward L. Ginzton, Wantagh, N. Y., assignors to The Board of Trustees of The Leland Stanford Junior University, Stanford University, Calif.

Original No. 2,294,942, dated September 8, 1942, Serial No. 366,358, November 20, 1940. Application for reissue April 2, 1943, Serial No. 481,658

18 Claims. (Cl. 250—36)

This invention relates, generally, to apparatus for maintaining ultra high frequency oscillators at a desired frequency difference, and the invention has reference, more particularly to a novel fixed frequency difference stabilization system for accomplishing this purpose.

It is often desirable in ultra high frequency work such as when measuring distances to be able to maintain two ultra high frequency oscillators at a fixed frequency difference without variation. Thus, it may be desirable to maintain two oscillators operating at frequencies of the order of $3\times10^9$ cycles per second at a fixed frequency difference of from 500 to 100,000 cycles per second. This type of apparatus is also useful for other purposes such as in medicine and wave guide communications.

The principal object of the present invention is to provide a novel fixed frequency difference stabilization system adapted to maintain ultra high frequency oscillators at a fixed frequency difference and without variation of such difference.

Another object of the present invention is to provide, in connection with ultra high frequency oscillators, a low frequency master oscillator to be used in determining and maintaining the desired fixed frequency difference between the ultra high frequency oscillators, the beat frequency between the latter oscillators being combined with the output of the master oscillator for purposes of control.

Other objects and advantages will become apparent from the specification, taken in connection with the accompanying drawing wherein the invention is embodied in concrete form.

In the drawing,

Fig. 1 is a wiring diagram of the fixed frequency difference stabilization system of this invention.

Fig. 2 is a vector diagram showing the sum and difference of the voltages derived from the mixer detector and from the master oscillator.

Fig. 3 is a wiring diagram of a somewhat modified arrangement.

Similar characters of reference are used in all of the above figures to indicate corresponding parts.

Referring now to Figs. 1 and 2 of the drawing, the reference numeral 1 designates one ultra high frequency oscillator of the order $3\times10^9$ cycles per second, whereas, reference numeral 2 designates another such oscillator which is to be maintained at a fixed frequency difference with respect to oscillator 1.

Oscillators 1 and 2 are of the electron beam excited hollow resonator type as shown in Patent No. 2,242,275, issued May 20, 1941, in the name of Russell H. Varian. In oscillator 1, electrons leaving the cathode 3 are accelerated by the accelerating battery 4 and pass through hollow resonators 5 and 6 successively which are intercoupled by the concentric line 7 and the loops shown to effect feed-back coupling. Resonator 5 serves to effect recurring changes in velocity of the electrons of the stream thereby effecting grouping of the electrons between the two resonators 5 and 6 so that the grouped stream on entering resonator 6 serves to set up strong oscillations therein, i. e., interchanges energy with the field of 6.

A third resonator 8 is used in connection with the oscillator 1 through which electrons pass after leaving resonator 6 to thereby set up oscillations in resonator 8 of the same frequency as obtained in resonators 5 and 6. There is no feed-back coupling between resonator 8 and resonator 6 so that the former serves as a buffer resonator for purposes which will appear later.

Oscillator 2 also comprises two resonators 5′ and 6′ which are excited by an electron stream emitted from cathode 3′ and caused to pass through the resonators by the accelerating battery 4′. A triode 9 is included between the positive side of the battery 4′ and ground to which resonators 5′ and 6′ are connected.

A feed-back 7′ is provided between resonators 5′ and 6′. Metal inserts 10 and 11 of the type shown in Patent No. 2,259,690, issued October 21, 1941, in the names of William W. Hansen, Russell H. Varian, and John R. Woodyard, are adjustably movable into the electromagnetic fields of resonators 5′ and 6′ for the purpose of varying the frequency of oscillator 2. The inserts 10 and 11 are shown connected to be operated from a motor 12, the field windings of which are shown controlled from an amplifier 13.

The field within resonator 5′ is shown coupled through use of loops and a concentric line 14 to the "buncher" resonator 15 of a mixer-detector 16 having a "catcher" resonator 17. This mixer-detector has an accelerating battery 18 for driving electrons through resonators 15 and 17. Resonator 17 is coupled with the coupling loops and concentric line 19 shown to the buffer resonator 8 of oscillator 1. Thus, since resonator 15 is excited at the frequency of oscillator 2 and as resonator 17 is excited at the frequency of resonator 8 due to the concentric line connections, the electron stream leaving resonator 17 will have two component frequencies; that of oscillator 1 and that of oscillator 2, which are detected by the detector grid 20 and cooperating plate 21, as shown in the above mentioned Patent No. 2,259,690.

Actually the grid 20 segregates the electrons according to their velocities so that only a portion of the electrons are collected by plate 21 which is one way of effecting detection. If desired, concentric line 19 could be connected from resonator 8 to resonator 15. Also, the concentric line 14 could connect either resonator 5' or 6' to either resonator 15 or 17. However, the connections shown in the drawing are deemed best since they provide complete isolation between oscillators 1 and 2 and prevent any tendency toward synchronization, i. e., zero beat frequency between the two. Since there is no feed-back coupling between resonator 8 and resonator 6 of oscillator 1, there is no tendency of the mixer-detector to alter the frequency of the oscillator 1, which would otherwise occur if this mixer-detector were coupled directly to the resonator 6.

The A. C. component of the detector output appears across resistor 23 and is passed through condenser 22 and, hence, is applied to the input of the audio amplifier 24, the output of which is applied to a voltage limiter 26, the output of which, in turn, is applied in series to primary winding 27 of a transformer 28 and to one primary winding 29 of a second transformer 30.

A master oscillator 31 of a frequency corresponding to the desired frequency difference between the controlled oscillators is shown connected to voltage limiter 32. Preferably the master oscillator 31 is adjustable as to frequency as by knob 33 so that this oscillator may be operated at any desired frequency of a suitable range of frequencies as from 500 to 100,000 cycles per second, although lower or higher frequencies can be used.

Voltage limiter 26 is adjustable as is also voltage limiter 32 so that the magnitude of the voltage output of limiter 32 can be made substantially the same as that of limiter 26. The system is so designed that as long as oscillators 1 and 2 maintain the desired frequency difference as determined by oscillator 31 and the outputs of the two voltage limiters are exactly 90° out of phase, then no correction as to frequency takes place. The output of voltage limiter 32 is supplied through a primary winding 34 of transformer 28 and reversely through primary winding 35 of transformer 30. Thus, as shown by arrows of Fig. 2, the voltage output of limiter 26 and that of limiter 32 are additive in transformer 28 and are subtractive in transformer 30.

Thus, referring now to Fig. 2, if the voltage output of limiter 26 is designated $v_1$ and that of limiter 32 is designated as $v_2$, then if these voltages are at right angles as shown in solid lines in the left hand portion of Fig. 2, the solid line resultant $r_1$ will be applied to the transformer 28, while the differences of these voltages, i. e., $v_2$—$v_1$ shown in solid lines in the right hand portion of Fig. 2 will have a solid line resultant $r_2$ which will be applied to the transformer 30. Transformer 28 is shown provided with a divided secondary winding 36 having its outer ends connected to the plates of diodes 37 and 38 and having its center connected through a resistance 39 and a by-pass condenser 65 to the cathodes of these diodes. Similarly, the transformer 30 has a divided secondary winding 40 having its outer ends connected to the plates of diodes 41 and 42, whereas its center tap is connected through a resistance 43 and by-pass condenser 61 to the cathodes of rectifiers 41 and 42. Lead 44 connects the two resistances 39 and 43 in series.

Thus, with the voltages supplied from the voltage limiters of the values shown in solid lines in Fig. 2, there will appear across resistor 39 a D. C. voltage proportional to vector $r_1$, whereas there will appear across resistor 43 a voltage proportional to vector $r_2$. Since vectors $r_1$ and $r_2$ are equal in magnitude, these voltages across resistors 39 and 43 being connected in opposition will cancel so that lead 45 connected to the center tap winding 36 will have no voltage but will be at ground potential since a lead 46 connects the corresponding center tap of winding 40 of the ground. However, should the frequency difference between oscillators 1 and 2 shift slightly by a small portion of a cycle, then the output of voltage limiter 26, i. e., $v_1$ will shift in phase as shown in Fig. 2 so that the sum of this shifted phase voltage together with voltage $v_2$ will produce the dotted line resultants $r_1'$ and $r_2'$ shown in Fig. 2, which resultants are of different magnitude resulting in different voltages appearing across resistances 39 and 43 so that a voltage appears upon lead 45 and is supplied to the grid of triode 9 and to the D. C. amplifier 13. This voltage appearing on lead 45 serves to increase or decrease the resistance of tube 9 depending upon the direction of the phase shift of vector $v_1$, which, in turn, depends upon whether the difference in the frequency between oscillators 1 or 2 is increasing or decreasing. Thus, the effective accelerating voltage of oscillator 2 is varied by tube 9 to alter the frequency of oscillator 2 to correct for the change in frequency differences. This correction in frequency is aided by the action of amplifier 13 operating through motor 12 to move the plungers 10 and 11. If desired, either the tube 9 or the plungers 10 and 11 could be used alone in correcting the frequency changes. Thus, it will be seen that any shift from the predetermined frequency difference between oscillators 1 and 2 will effect a corresponding phase shift in the output of mixer-detector 16 and in the output of voltage limiter 26, thereby causing the desired correction to take place to maintain the frequency difference fixed as determined by the frequency of master oscillator 31. This automatic frequency control system is claimed broadly in our application Serial No. 503,760, filed September 25, 1943, which is a division of our application Serial No. 443,604, filed May 19, 1942, which latter application is a continuation-in-part of the present case. This system is also claimed more specifically in application Serial No. 503,759, filed September 25, 1943, which is a division of application Serial No. 426,986, filed January 16, 1942, and is also a continuation-in-part of the present case.

In the modification shown in Fig. 3, the transformers 28 and 30 are eliminated. This may be desirable since these transformers may produce a slight phase shift. In Fig. 3, the output of voltage limiter 26 is connected to phase inverter 48 so that the voltage appearing across resistor 49 of this phase inverter will be in inverted phase and have the same value as the output of voltage limiter 26. This voltage is applied to one grid of a double-grid difference voltage amplifier tube 51 having its other grid connected to voltage limiter 32. A double-grid sum amplifier 51 has one grid thereof connected across resistor 52 of the phase inverter having the same A. C. voltage as that across resistor 53 of this inverter so that the voltage applied to tube 51 from resistor 52 will be equal to and in phase with the voltage output of limiter 26. The other grid of tube 51 is connected to voltage limiter 32. The A. C. output of tube 50 is connected through condenser 54 and appears across resistor 55 for application to diode 56 so that a rectified D. C. voltage appears across a resistance 57 in the circuit of tube 56 which is proportional to the difference resultant $r_2$ of Fig. 2.

Likewise, a D. C. voltage appears across a resistance 58 of rectifier 59 in the output of tube 51 which voltage is proportional in magnitude to the resultant $r_1$, which is the sum of vectors $v_1$ and $v_2$. Resistors 57 and 58 are connected in series opposition and through lead 45 as described in connection with Fig. 1, to the grid of tube 9 (see Fig. 1) and to the D. C. amplifier 13, as previously explained. The operation of the structure of Fig. 3 is otherwise similar to that of Fig. 1 and would appear to require no further description.

As many changes could be made in the above construction and many apparently widely different embodiments of this invention could be made without departing from the scope thereof, it is intended that all matter contained in the above description or shown in the accompanying drawing shall be interpreted as illustrative and not in a limiting sense.

The fixed frequency difference stabilization system of this invention is particularly valuable in wave guide communication for maintaining separate frequency channels at the desired fixed frequency differences.

What is claimed is:

1. A fixed frequency difference stabilization system comprising a plurality of ultra high frequency oscillators having electron beam excited electron grouping and energy interchanging resonators, means for varying the frequency of at least one of said oscillators by varying an operating characteristic thereof, mixer-detector means having resonators respectively connected to said oscillators, a master frequency oscillator, means connected for producing a voltage comprising the sum and difference of a version of the output voltage of said mixer-detector means and said master oscillator, and means connecting said produced voltage to said frequency varying means for controlling the latter to maintain said ultra high frequency oscillators at a fixed frequency difference.

2. A fixed frequency difference stabilization system comprising ultra high frequency oscillators, a mixer-detector connected to said oscillators for producing a beat frequency, means for amplifying the output of said mixer detector, a master oscillator, voltage limiter means for limiting the voltage outputs of said amplifying means and said master oscillator, means for adding and subtracting said limited voltage outputs, and means utilizing the resultants of said voltage addition and subtraction to control the relative frequency of said ultra high frequency oscillators.

3. A fixed frequency difference stabilization system comprising ultra high frequency oscillators, a mixer-detector connected to said oscillators for producing a beat frequency, means for amplifying the alternating current output of said mixer-detector, a master oscillator, voltage limiter means for limiting the alternating current voltage output of said amplifying means and said master oscillator, means for adding and subtracting said limited voltage outputs, means for rectifying the resultant sum and difference voltages, frequency varying means, and means connecting the rectified voltages in opposition and connected to said frequency varying means for controlling the relative frequency of said ultra high frequency oscillators.

4. In a fixed frequency difference stabilization system, electron stream excited oscillators comprising spaced electron stream velocity changing and energy interchanging hollow resonators, a mixer-detector, one of said oscillators having an additional buffer resonator unilaterally coupled by the electron stream to the velocity changing and energy interchanging resonators of such oscillator, and means coupling said buffer resonator and one of the resonators of said other oscillator to said mixer-detector.

5. In a fixed frequency difference stabilization system, electron stream excited oscillators comprising spaced electron stream velocity changing and energy interchanging hollow resonators, a mixer-detector also having spaced electron stream velocity changing and energy interchanging hollow resonators, one of said oscillators having an additional buffer resonator unilaterally coupled by the electron stream to the velocity changing and energy interchanging resonators of such oscillator, and means coupling said buffer resonator and one of the resonators of said other oscillator to said mixer-detector, said buffer resonator serving to prevent one of said oscillators from directly influencing the frequency of the other, said mixer-detector having detector means for segregating electrons according to their velocities.

6. In ultra-high frequency oscillator apparatus, an electron stream excited oscillator comprising means producing an electron stream, velocity changing, energy interchanging and buffer hollow resonators mutually spaced apart in succession along the stream, mechanical means coupling said velocity changing and energy interchanging resonators together, said buffer resonator being but unilaterally coupled to said other resonators by the electron stream, and means for extracting oscillator output energy from said buffer resonator, said buffer resonator serving to prevent said energy extracting means from varying the frequency of said oscillator.

7. In ultra-high frequency oscillator apparatus, an electron stream excited oscillator comprising means producing an electron stream, coupled velocity changing and energy interchanging tuned circuit means mutually spaced apart in succession along the stream, and a buffer resonator tuned to the same frequency as said tuned circuit means and unilaterally coupled to said tuned circuit means by the electron stream, and means for extracting output energy from said buffer resonator, said buffer resonator thereby serving to prevent said energy extracting means from varying the frequency of said oscillator.

8. The apparatus defined in claim 7 wherein said tuned circuit means comprise hollow resonators.

9. In ultra high frequency apparatus, electron stream excited oscillators each comprising velocity changing and energy interchanging hollow resonator means, a buffer resonator unilaterally coupled by the electron stream to the resonator means of one of said oscillators, and means coupling said buffer resonator to the resonator means of said other oscillator.

10. The apparatus defined in claim 9, wherein said buffer resonator is tuned to the same frequency as said one oscillator.

11. In a frequency stabilization system, two oscillators, each comprising means producing an electron stream and velocity changing and energy interchanging hollow resonator means through which said stream is passed, means electrically coupling the resonator means of the respective oscillators, and buffer means between said coupling means and one of said resonator means for preventing said coupling means from influencing the frequency of the oscillator embodying said one resonator means, said buffer means comprising an additional hollow resonator means coupled to its associated oscillator by the corresponding electron stream.

12. In ultra high frequency apparatus, an electron beam excited oscillator, means for utilizing at least a part of the output energy of said oscillator, and buffer means electrically interconnecting said oscillator and said utilization means comprising hollow resonator means unilaterally coupled to said oscillator by said electron beam and tuned to the output frequency of said oscillator.

13. In ultra high frequency apparatus, two oscillators, and a mixer-detector coupled to said oscillators, said mixer-detector comprising a pair of hollow resonators coupled respectively to said oscillators, means for passing an electron stream successively through said resonators, and detector means responsive to said stream for producing a beat frequency between the frequencies of said oscillators.

14. In ultra high frequency apparatus, two oscillators, a mixing device comprising a pair of spaced hollow resonators and means for passing an electron beam successively through said resonators, means for coupling each one of said oscillators to a different resonator, and detector means in the path of the beam beyond said resonators for producing a beat frequency between the frequencies of said oscillators.

15. In a frequency correlation system, two electron-beam oscillators, a mixer-detector, hollow resonator means unilaterally coupled to one of said oscillators by its electron beam, means coupling the output of said resonator means to said mixer-detector, and means independently coupling said mixer detector to said other oscillator.

16. In a fixed frequency difference stabilization system, an oscillator for producing an electron velocity modulated beam, hollow buffer resonator means coupled to said oscillator by said beam, a mixer-detector coupled to the output of said buffer resonator, and another oscillator having its output coupled to said mixer-detector.

17. Ultra high frequency apparatus, comprising means for producing an electron stream, a plurality of cavity resonators coupled in energy-interchanging relation with said stream, means for supplying ultra high frequency energy of a predetermined frequency to one of said resonators, means for supplying ultra high frequency energy of a different frequency to a second resonator, and detector means in the path of the beam beyond said resonators for producing a frequency different from said supplied frequencies.

18. Ultra high frequency apparatus comprising means for producing an electron stream, a plurality of cavity resonators coupled in energy-interchanging relation with said stream, means for supplying ultra high frequency energy of a predetermined frequency to one of said resonators, means for supplying ultra high frequency energy of a different frequency to a second resonator, and detector means responsive to said stream for producing a frequency different from said supply frequencies.

RUSSELL H. VARIAN.
WILLIAM W. HANSEN.
EDWARD L. GINZTON.